United States Patent
Blazo

(10) Patent No.: US 6,785,345 B2
(45) Date of Patent: Aug. 31, 2004

(54) FREQUENCY DITHERING FOR DDS SPECTRAL PURITY

(75) Inventor: Stephen F. Blazo, Mulino, OR (US)

(73) Assignee: Tektronix, Inc., Beaverton, OR (US)

( * ) Notice: Subject to any disclaimer, the term of this patent is extended or adjusted under 35 U.S.C. 154(b) by 722 days.

(21) Appl. No.: 09/765,770

(22) Filed: Jan. 18, 2001

(65) Prior Publication Data

US 2002/0094053 A1 Jul. 18, 2002

(51) Int. Cl.[7] .......................... H04L 27/22; H03B 21/00
(52) U.S. Cl. ........................ 375/326; 375/327; 375/308; 327/106; 327/107
(58) Field of Search ................................ 375/326, 327, 375/329, 243, 279, 308, 371, 373, 376; 327/105, 106, 107

(56) References Cited

U.S. PATENT DOCUMENTS 5,757,239 A * 5/1998 Gilmore ...................... 375/376

6,333,649 B1 * 12/2001 Dick et al. .................. 327/105

OTHER PUBLICATIONS

Qualcomm Incorporated, "Hybrid PLL/DDS Frenquency Synthesizers" AN2334–4 Application Note, p. 24–25, CL80-3459–1A.

Michael J. Flanagan and George A. Zimmerman, "Spur–Reduced Digital Sinusoid Synthesis", IEEE Transactions on Communications, vol. 43, No. 7, Jul. 1995.

* cited by examiner

Primary Examiner—Young T. Tse
Assistant Examiner—David B. Lugo
(74) Attorney, Agent, or Firm—Francis I. Gray

(57) ABSTRACT

A frequency dither technique is used for reducing spurs due to phase increment errors in a direct digital synthesizer output sinusoid. The spurs for a desired output frequency are calculated and, if the spurs fall within a phase locked loop bandwidth, a pair of phase increment values are used representing a pair of frequencies that average to the desired output frequency and the spurs of which fall outside the phase locked loop bandwidth.

2 Claims, 1 Drawing Sheet

FREQUENCY DITHERING FOR DDS SPECTRAL PURITY

BACKGROUND OF THE INVENTION

The present invention relates to the direct digital synthesis of sinusoidal signals, and more directly to a frequency dither technique for reducing phase modulation errors made in the use of a direct digital synthesizer (DDS) to generate a reference frequency.

A DDS is a very convenient and well known means of generating sinusoidal waves with very fine frequency resolution and stable average frequency. A typical DDS has an accumulator having as an input a phase increment and a feedback value from a phase register and having as an output an accumulated phase value for storing in the phase register. The output from the phase register also is truncated and applied as an address to a SIN( ) lookup table to generate a series of digital values that, when converted to an analog signal by a digital-to-analog converter, results in a sinusoidal waveform at a desired frequency determined by the phase increment value. The use of a DDS has been limited by artifacts in the output due to quantization errors implicit in its very nature. The major limit to the spectral purity of a DDS generated signal is the phase quantization due to the SIN( ) lookup table having a limited number of entries. Typically the phase accumulator and register contain 32 bits. However only 12 of these may be passed on to the SIN( ) lookup table. The result of this is a sawtooth waveform of phase error having a magnitude of $2^{-12}$ cycles of the generated rate. This may cause significant spurs in the output spectrum of the generated reference frequency.

One way to reduce the effect of spurs is to lock the DDS to another oscillator, typically a voltage controlled oscillator (VCO) in a phase locked loop (PLL) with a bandwidth smaller than the closest spur generated by the truncation process. This attenuates spurs outside the loop bandwidth of the PLL. This also has the useful feature of upconverting the DDS output to a higher frequency if desired, as is typical. Unfortunately the spurs for certain generated frequencies still fall within the loop bandwidth and are not attenuated. Application Note AN2334-4, pages 24–25, from QUALCOMM Incorporated, VLSI Products Division of San Diego, Calif. shows how to calculate the location of the spurs.

Another way to reduce the effect of spurs, as described in IEEE Transactions on Communications, Vol. 43, No. 7, July 1995 at pages 2254–2262 by Flanagan and Zimmerman "Spur-Reduced Digital Sinusoid Synthesis", is through the use of a pseudorandom number (PRN) sequence applied to the phase and amplitude quantizer. This technique allows a general reduction in spurs, but with a rather slow improvement rate.

What is desired is a technique for reducing spurs caused by phase quantization in a DDS.

BRIEF SUMMARY OF THE INVENTION

Accordingly the present invention uses frequency dithering for achieving DDS spectral purity. The location of spurs is located and nothing is done if the spurs fall outside of the loop bandwidth of an external PLL. However if the spurs fall within the loop bandwidth, the output frequency is generated by the generation of two frequencies on either side of a desired output frequency so that their average frequency equals the desired output frequency. These output frequencies have the property that their spurs fall outside the PLL loop bandwidth.

The objects, advantages and other novel features of the present invention are apparent from the following detailed description when read in conjunction with the appended claims and attached drawing.

DETAILED DESCRIPTION OF THE INVENTION

Figure 1:
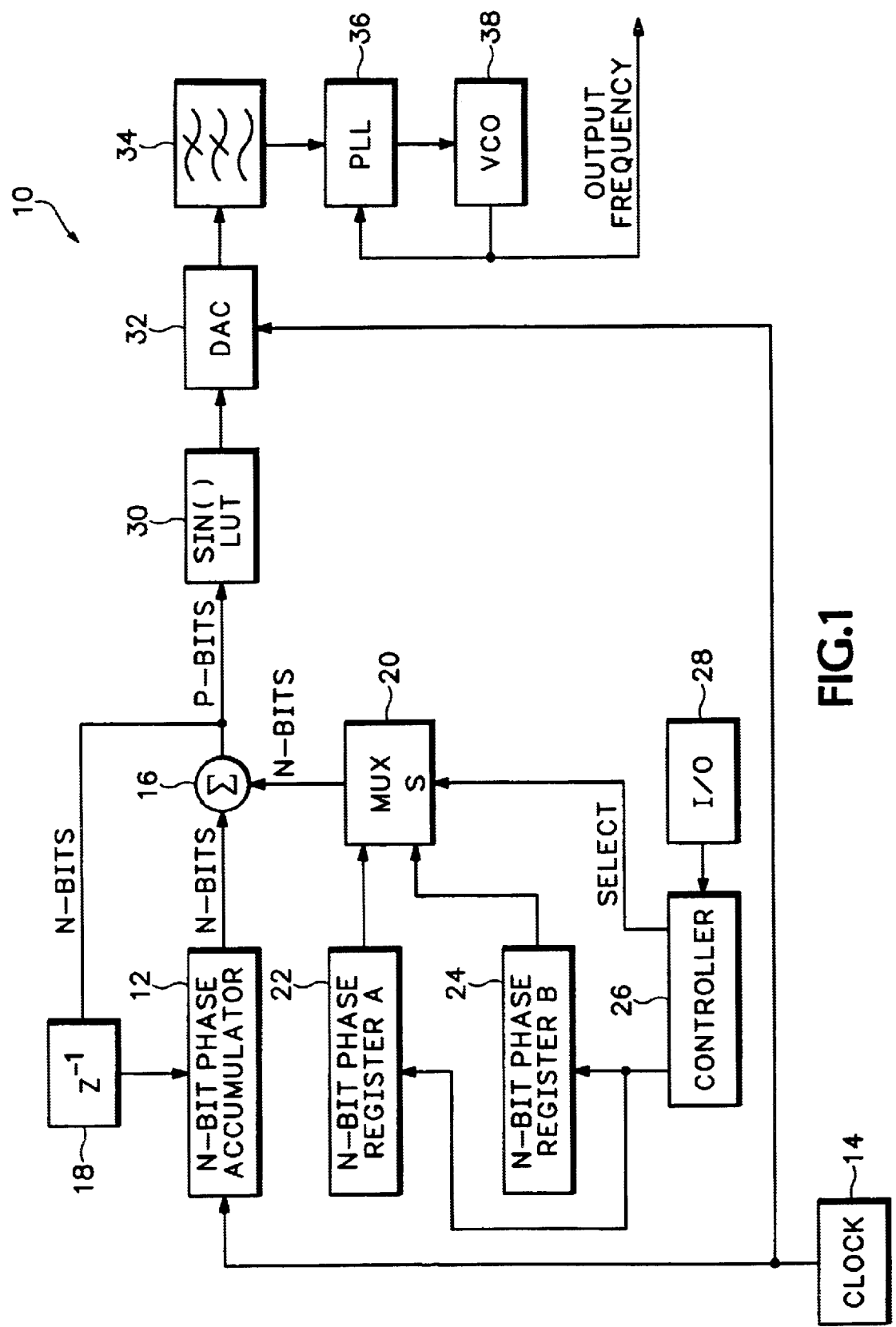
FIG. 1 is a block diagram view of a direct digital synthesizer having frequency dithering according to the present invention.

Referring now to FIG. 1 a direct digital synthesizer 10 is shown. A phase accumulator 12 is clocked by a system clock from a clock source 14 to update the contents of the accumulator according to a value applied at an input. An output from the phase accumulator 12 is applied to an adder 16 having an output that is fed back via a delay element 18 to the input of the phase accumulator. A phase increment is also applied to the adder 16 from a multiplexer 20 to which are input phase increment values from two phase increment registers 22, 24. The values in the phase increment registers 22, 24 are loaded from a controller 26 in response to a desired frequency output input via an input/output (I/O) circuit 28. The controller 26 also provides a select signal for the multiplexer 20. A truncated portion of the output from the adder 16 is used to access a SIN( ) lookup table (LUT) 30 to generate a sequence of digital data representing the desired frequency output. The digital data is converted to an analog sinusoid by a digital-to-analog converter (DAC) 32 and smoothed by a lowpass filter 34. The smoothed analog sinusoid is input to a phase locked loop (PLL) 36, the output of which controls a voltage controlled oscillator (VCO) 38 that serves to upconvert the DDS output frequency of the smoothed analog sinusoid. The VCO 38 provides the feedback signal for the PLL 36.

In operation the desired output frequency is input via the I/O circuit 28 and the controller 26 calculates where spurs fall for the desired output frequency. If the spurs fall within the loop bandwidth of the PLL 36, then the phase increments for two frequencies that straddle the desired output frequency are loaded by the controller 26 into the phase increment registers 22, 24 and an appropriate duty cycle clock signal is applied to the multiplexer 20 as the select signal so that the SIN( ) LUT 30 outputs digital data for the two frequencies, which frequencies combine to average the desired output frequency. These frequencies have the property that their spurs fall outside the loop bandwidth of the PLL 36 at the desired output frequency. The time spent at each frequency as determined by the select signal is great enough so that the sawtooth waveform of phase error has at least one full cycle, i.e., the frequency dither is large enough to trip the quantization error bit, in order to be effective. The time also is significantly less than 1/(loop bandwidth) in order for the loop to filter the average frequency out. These considerations provide design guidelines for the implementation. The resulting improvement rate has been shown to be much faster than the PRN technique discussed above, and does not require nearly as narrow a loop bandwidth from the tracking VCO 38. The loop bandwidth of the VCO is designed to minimize the phase noise contribution of the VCO which argues for a higher rather than lower loop bandwidth.

Thus the present invention provides frequency dithering for reducing spurs due to phase quantization errors in an output frequency signal from a DDS by determining where spurs occur at the desired output frequency and, if the spurs fall within the PLL loop bandwidth, outputting two frequencies whose spurs fall outside the loop bandwidth and that average to the desired output frequency.

What is claimed is:

1. A method for reducing spurs in a desired output frequency resulting from phase quantization errors in a direct digital synthesizer comprising the steps of:

calculating for the desired output frequency where the spurs fall with respect to a phase locked loop bandwidth;

if the spurs fall within the phase locked loop bandwidth generating from the direct digital synthesizer a pair of output frequencies that average to the desired output frequency and whose spurs fall outside the phase locked loop bandwidth.

2. An apparatus for reducing spurs in a desired output frequency resulting from phase quantization errors in a direct digital synthesizer comprising:

means for accumulating a phase increment, the accumulated phase increment being an N-bit digital value;

means for generating from a truncated version of the N-bit digital value digital data representing the desired output frequency;

means for calculating spurs for the desired output frequency; and if the spurs fall within a phase locked loop bandwidth, means for alternating the phase increment between a pair of values representing a pair of output frequencies that average to the desired output frequency and the spurs of which fall outside the phase locked loop bandwidth.

* * * * *